US009836895B1

(12) United States Patent
Nygaard et al.

(10) Patent No.: US 9,836,895 B1
(45) Date of Patent: Dec. 5, 2017

(54) SIMULATING VIRTUAL OBJECTS

(71) Applicant: Waymo LLC, Mountain View, CA (US)

(72) Inventors: Carl Nygaard, Sunnyvale, CA (US); James Stout, Mountain View, CA (US); Jiajun Zhu, Palo Alto, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 14/744,891

(22) Filed: Jun. 19, 2015

(51) Int. Cl.
*G01C 22/00* (2006.01)
*G05D 1/00* (2006.01)
*G07C 5/08* (2006.01)
*G06F 17/50* (2006.01)

(52) U.S. Cl.
CPC ....... *G07C 5/0841* (2013.01); *G06F 17/5009* (2013.01)

(58) Field of Classification Search
USPC .......................................................... 701/23
See application file for complete search history.

(56) References Cited

U.S. PATENT DOCUMENTS

| | | | | |
|---|---|---|---|---|
| 5,850,352 A | * | 12/1998 | Moezzi | H04N 5/222 345/419 |
| 6,570,555 B1 | * | 5/2003 | Prevost | G06F 3/038 345/156 |
| 7,639,888 B2 | * | 12/2009 | Steinberg | H04N 5/23212 348/208.99 |
| 8,068,983 B2 | | 11/2011 | Vian et al. | |
| 8,190,295 B1 | * | 5/2012 | Garretson | G05D 1/0038 700/245 |
| 8,532,863 B2 | * | 9/2013 | Hadsell | G05D 1/0246 700/245 |
| 8,774,981 B2 | * | 7/2014 | Paz-Meidan | B25J 5/00 700/245 |
| 8,803,952 B2 | * | 8/2014 | Katz | A63F 13/06 348/47 |
| 8,825,350 B1 | * | 9/2014 | Robinson | G08G 1/0116 340/909 |

(Continued)

OTHER PUBLICATIONS

Gechter et al., "Towards a Hybrid Real/Virtual Simulation of Autonomous Vehicles for Critical Scenarios", SIMUL 2014: The Sixth INternational Conference on Advances in System Simulation, 4 pages.

(Continued)

*Primary Examiner* — Jean-Paul Cass
(74) *Attorney, Agent, or Firm* — Lerner, David, Littenberg, Krumholz & Mentlik, LLP

(57) ABSTRACT

An autonomous vehicle is tested using virtual objects. The autonomous vehicle is maneuvered, by one or more computing devices, the autonomous vehicle in an autonomous driving mode. Sensor data is received corresponding to objects in the autonomous vehicle's environment, and virtual object data is received corresponding to a virtual object in the autonomous vehicle's environment. The virtual object represents a real object that is not in the vehicle's environment. The autonomous vehicle is maneuvered based on both the sensor data and the virtual object data. Information about the maneuvering of the vehicle based on both the sensor data and the virtual object data may be logged and analyzed.

20 Claims, 12 Drawing Sheets

(56) References Cited

U.S. PATENT DOCUMENTS

| | | | |
|---|---|---|---|
| 8,850,337 B2 * | 9/2014 | Ooi | G06T 19/006 |
| | | | 715/757 |
| 9,044,863 B2 * | 6/2015 | Mead | B25J 9/1697 |
| 9,443,436 B2 * | 9/2016 | Scheidt | G05B 19/0428 |
| 9,547,112 B2 * | 1/2017 | Mead | G02B 5/30 |
| 9,630,631 B2 * | 4/2017 | Alaniz | B60W 50/14 |
| 2002/0168618 A1 * | 11/2002 | Anderson | A61F 2/07 |
| | | | 434/262 |
| 2003/0112132 A1 * | 6/2003 | Trajkovic | B60K 35/00 |
| | | | 340/435 |
| 2005/0096960 A1 * | 5/2005 | Plutowski | G06F 17/30905 |
| | | | 705/7.29 |
| 2006/0211462 A1 * | 9/2006 | French | A63B 24/0003 |
| | | | 463/1 |
| 2008/0033684 A1 | 2/2008 | Vian et al. | |
| 2009/0208058 A1 * | 8/2009 | Schofield | G06K 9/00818 |
| | | | 382/103 |
| 2009/0313566 A1 * | 12/2009 | Vian | G06T 15/00 |
| | | | 715/765 |
| 2010/0020306 A1 * | 1/2010 | Hall | G01S 7/4813 |
| | | | 356/5.01 |
| 2010/0170330 A1 * | 7/2010 | Scheepers | G01M 17/0078 |
| | | | 73/116.01 |
| 2012/0044476 A1 * | 2/2012 | Earhart | G01S 3/7867 |
| | | | 356/4.01 |
| 2012/0092234 A1 * | 4/2012 | Trooskin-Zoller | G06F 3/1446 |
| | | | 345/1.3 |
| 2012/0173067 A1 * | 7/2012 | Szczerba | G02B 27/01 |
| | | | 701/23 |
| 2013/0120158 A1 * | 5/2013 | Tombley | G08G 1/164 |
| | | | 340/902 |
| 2013/0290876 A1 * | 10/2013 | Anderson | G06T 19/006 |
| | | | 715/761 |
| 2014/0344725 A1 * | 11/2014 | Bates | G06Q 10/10 |
| | | | 715/757 |
| 2015/0067864 A1 * | 3/2015 | Barkan | G06F 21/57 |
| | | | 726/24 |
| 2015/0097863 A1 * | 4/2015 | Alaniz | G06T 19/006 |
| | | | 345/633 |
| 2015/0244952 A1 * | 8/2015 | Tani | H04N 5/3658 |
| | | | 348/246 |
| 2016/0003636 A1 * | 1/2016 | Ng-Thow-Hing | H04N 7/188 |
| | | | 701/26 |
| 2016/0300252 A1 * | 10/2016 | Frank | G06Q 30/0203 |
| 2016/0349835 A1 * | 12/2016 | Shapira | G06F 3/011 |
| 2016/0371977 A1 * | 12/2016 | Wingate | H04R 3/04 |
| 2017/0132118 A1 * | 5/2017 | Stefan | B60W 50/04 |
| 2017/0177954 A1 * | 6/2017 | Micks | G06K 9/00805 |
| 2017/0186240 A1 * | 6/2017 | Alaniz | G06T 19/006 |
| 2017/0193338 A1 * | 7/2017 | Huberman | G06K 9/66 |

OTHER PUBLICATIONS

Sukthankar et al., "A Simulation and Design System for Tactical Driving Algorithms", 1996.

Verburg et al., "Developing and testing intelligent vehicles", Proceedings IEEE Intelligent Vehicle System Symposium (IV'2002) Versailles, France, Jun. 18-20, 2002.

\* cited by examiner

| Time | Location | Heading | Acceleration Value | Contact with Virtual Object | Error | Error Type |
|---|---|---|---|---|---|---|
| T = 0 | X0, Y0, Z0 | H0 | A0 | No | No | N/A |
| T = 1 | X1, Y1, Z1 | H1 | A1 | No | No | N/A |
| T = 2 | X2, Y2, Z2 | H2 | A2 | No | No | N/A |
| ⋮ | ⋮ | ⋮ | ⋮ | ⋮ | ⋮ | ⋮ |
| T = n | Xn, Yn, Zn | H3 | An | No | No | N/A |

| Object Type | Physical Charateristics |
|---|---|
| Pedestrian | C1 |

1120

A

| Time | Location | Heading | Acceleration Value |
|---|---|---|---|
| T = 0 | XA0, YA0, ZA0 | HA0 | AA0 |
| T = 1 | XA1, YA1, ZA1 | HA1 | AA1 |
| ⋮ | ⋮ | ⋮ | ⋮ |
| T = n | XAn, YAn, ZAn | HA3 | AAn |

1160

B

| Time | Location | Heading | Acceleration Value |
|---|---|---|---|
| T = 0 | XB0, YB0, ZB0 | HB0 | AB0 |
| T = 1 | XB1, YB1, ZB1 | HB1 | AB1 |
| ⋮ | ⋮ | ⋮ | ⋮ |
| T = n | XBn, YBn, ZBn | HB3 | ABn |

FIGURE 11

SIMULATING VIRTUAL OBJECTS

BACKGROUND

Autonomous vehicles, such as vehicles which do not require a human driver, may be used to aid in the transport of passengers or items from one location to another. An important component of an autonomous vehicle is the perception system, which allows the vehicle to perceive and interpret its surroundings using various sensors such as cameras, radar, lasers, and other similar devices. For example, autonomous vehicles may use the sensors to gather and interpret images and sensor data about its surrounding environment, e.g., parked cars, trees, buildings, etc. Information from the perception system may be used by these vehicles to make numerous decisions while the autonomous vehicle is in motion, such as speeding up, slowing down, stopping, turning, etc.

When testing autonomous vehicles, it can be difficult, expensive, and dangerous to set up certain real-life scenarios. For example, to test the autonomous vehicle's reaction to a jaywalker stepping in front of the vehicle, it would be dangerous to use a real person, and expensive and time consuming to set up a realistic dummy.

BRIEF SUMMARY

One aspect of the disclosure provides a method of testing an autonomous vehicle using virtual objects. The method includes maneuvering, by one or more computing devices, the autonomous vehicle in an autonomous driving mode, receiving sensor data corresponding to objects in the autonomous vehicle's environment, and receiving virtual object data corresponding to a virtual object in the autonomous vehicle's environment, the virtual object representing a real object that is not in the vehicle's environment. The method further includes maneuvering, by the one or more computing devices, the autonomous vehicle based on both the sensor data and the virtual object data, and logging, by the one or more computing devices, information about the maneuvering of the vehicle based on both the sensor data and the virtual object data.

Another aspect of the disclosure provides an autonomous vehicle. The autonomous vehicle includes one or more maneuvering systems, including a steering system, an acceleration system, and a deceleration system. The vehicle further includes a perception system adapted to detect real objects in the autonomous vehicle's environment, and one or more processors configured to receive virtual object data corresponding to a virtual object in the autonomous vehicle's environment, the virtual object representing a real object that is not in the vehicle's environment. At least one of the one or more maneuvering systems is adapted to maneuver the autonomous vehicle based on both the real object data and the virtual object data.

A further aspect of the disclosure provides a system for testing an autonomous vehicle using virtual objects. The system includes one or more memories storing virtual object data and one or more computing devices in communication with the one or more memories. The one or more computing devices are configured to receive real object data corresponding to real objects detected in the autonomous vehicle's environment, receive virtual object data corresponding to a virtual object in the autonomous vehicle's environment, the virtual object representing a real object that is not in the vehicle's environment, and maneuver the autonomous vehicle based on both the real object data and the virtual object data.

BRIEF DESCRIPTION OF THE DRAWINGS

FIG. 10 is an example of vehicle response data in accordance with aspects of the disclosure.

FIG. 11 is an example of fictitious sensor data including alternate behavior in accordance with aspects of the disclosure.

DETAILED DESCRIPTION

Overview

The technology relates to testing the behavior, dynamics and response time of autonomous vehicles in various scenarios. When testing autonomous vehicles, it can be difficult, expensive and even dangerous to set up certain real-life scenarios. For example, it would be inherently dangerous to test the situation of a jaywalker using a real person and could be expensive (and even dangerous) to use a dummy or other object. Typical simulations may involve offline testing of an autonomous vehicle's computers in a lab setting, but these simulations may rely too much of computer estimates of how the vehicle would drive on a physical road, thus lacking some aspects of unpredictability in the response of an actual physical vehicle. In this regard, it can very helpful to test an autonomous vehicle in various scenarios on actual roadways using virtual objects.

Figure 5:
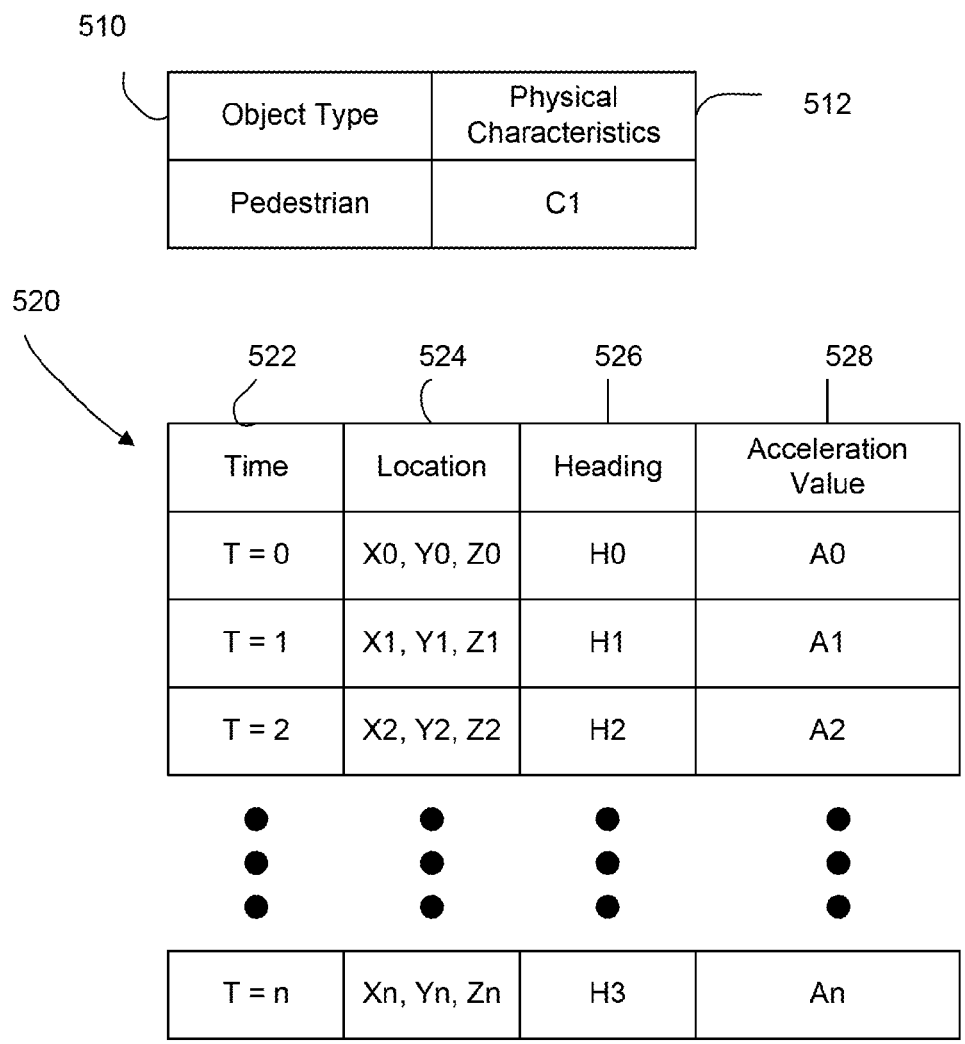
FIG. 5 is an example of fictitious sensor data in accordance with aspects of the disclosure.
Figure 6:
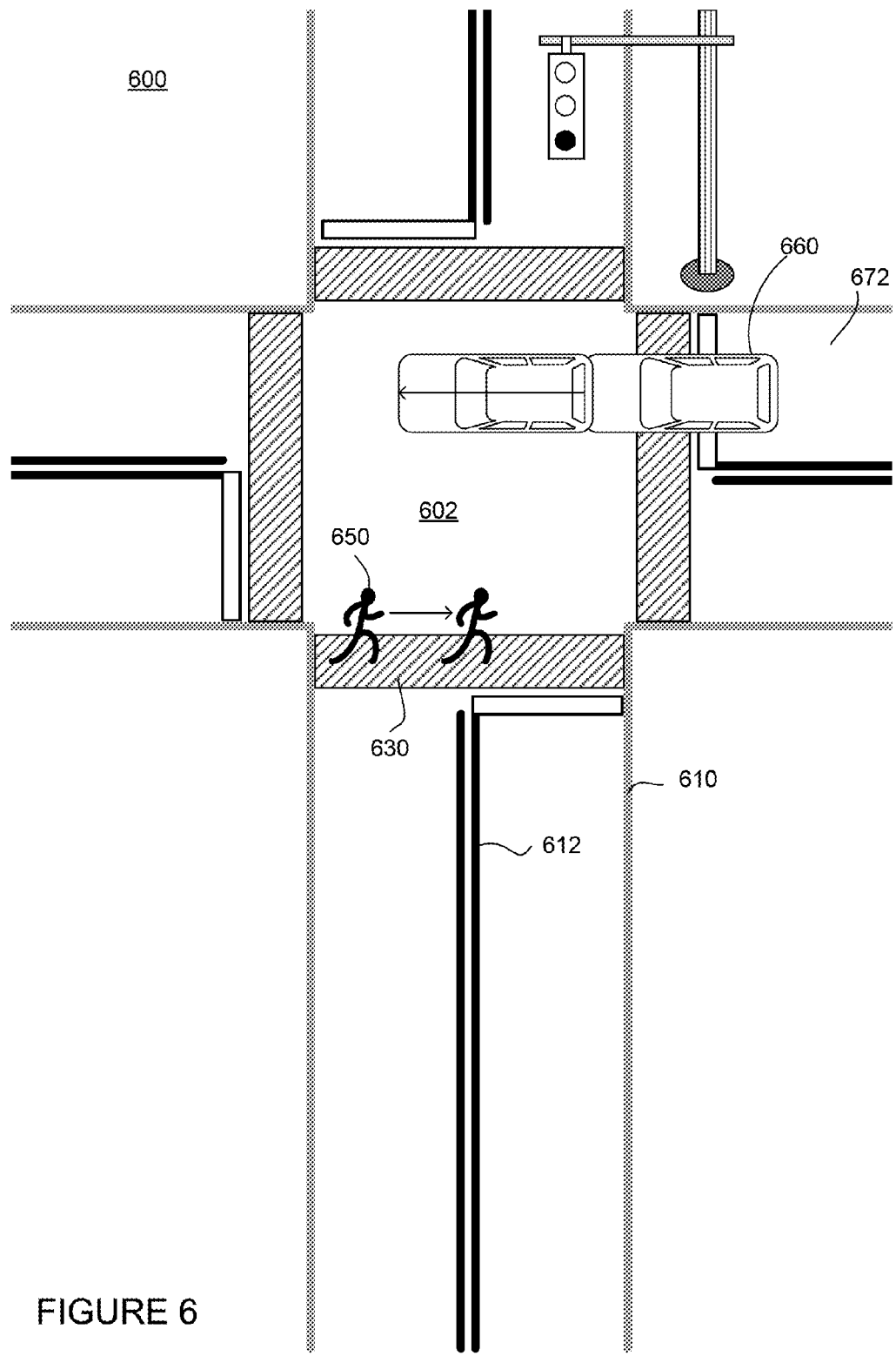
FIG. 6 is an example bird's eye view of a section of roadway including an intersection and data in accordance with aspects of the disclosure.

In order to test an autonomous vehicle, a user must first create the features of the scenario. This may include inputting information about a virtual object. For example, a user may specify a virtual object and its type, such as car, pedestrian, bicyclist, construction object, etc. Each object may be given an initial geographic location for a particular time when the object will appear as shown in FIGS. 5 and 6.

In some cases, such as a vehicle or pedestrian, the object may be given a behavior plan. A behavior plan may be based on a behavior that the user would like the virtual object to follow. Thus, example behaviors may include a pedestrian walking in front of the vehicle, other vehicles tailgating, other vehicles cutting into a lane in front or behind the autonomous vehicle.

A behavior plan may include an object path. The simplest object path may include a linear path between the initial geographic location and a second geographic location. The path may also include information about the speed of the object (accelerating, decelerating, both at different times, etc.). Another example of a path may include a series of locations as opposed to only two. Again this type of path would also include information about the speed of the object. In a third more complex example, the path may include a reactive feature where the object will react to the autonomous vehicle or another object (such as other vehicles or a stop sign).

Once the features have been provided, the features may be converted into fictitious sensor data. The fictitious sensor data may correspond to information provided to the autonomous vehicle's computers by the vehicle's perception system. A perception system may include various sensors such as radar, laser, sonar, cameras, etc. that the autonomous vehicle's computer relies upon to detect objects in the autonomous vehicle's environment. As an example, the fictitious sensor data may include information such as location, direction, speed, physical characteristics (size, shape, etc.) for each virtual object at a series of different times (t=0, 1, 2, ... n) when the autonomous vehicle would interact with the virtual object given the locations of the autonomous vehicle and the virtual object.

Figure 7:
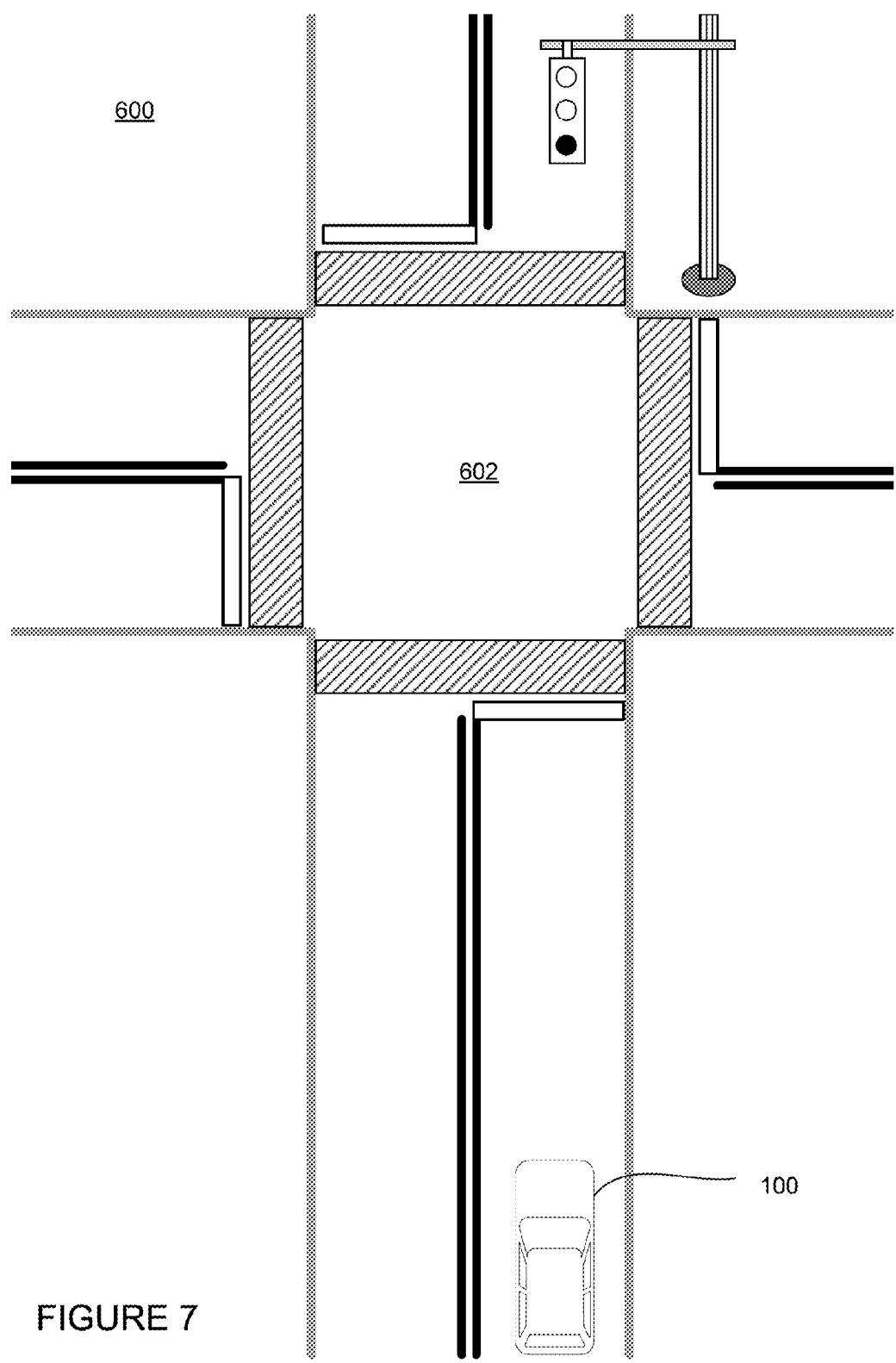
FIG. 7 is an example bird's eye view of an autonomous vehicle in a section of roadway including an intersection in accordance with aspects of the disclosure.
Figure 8:
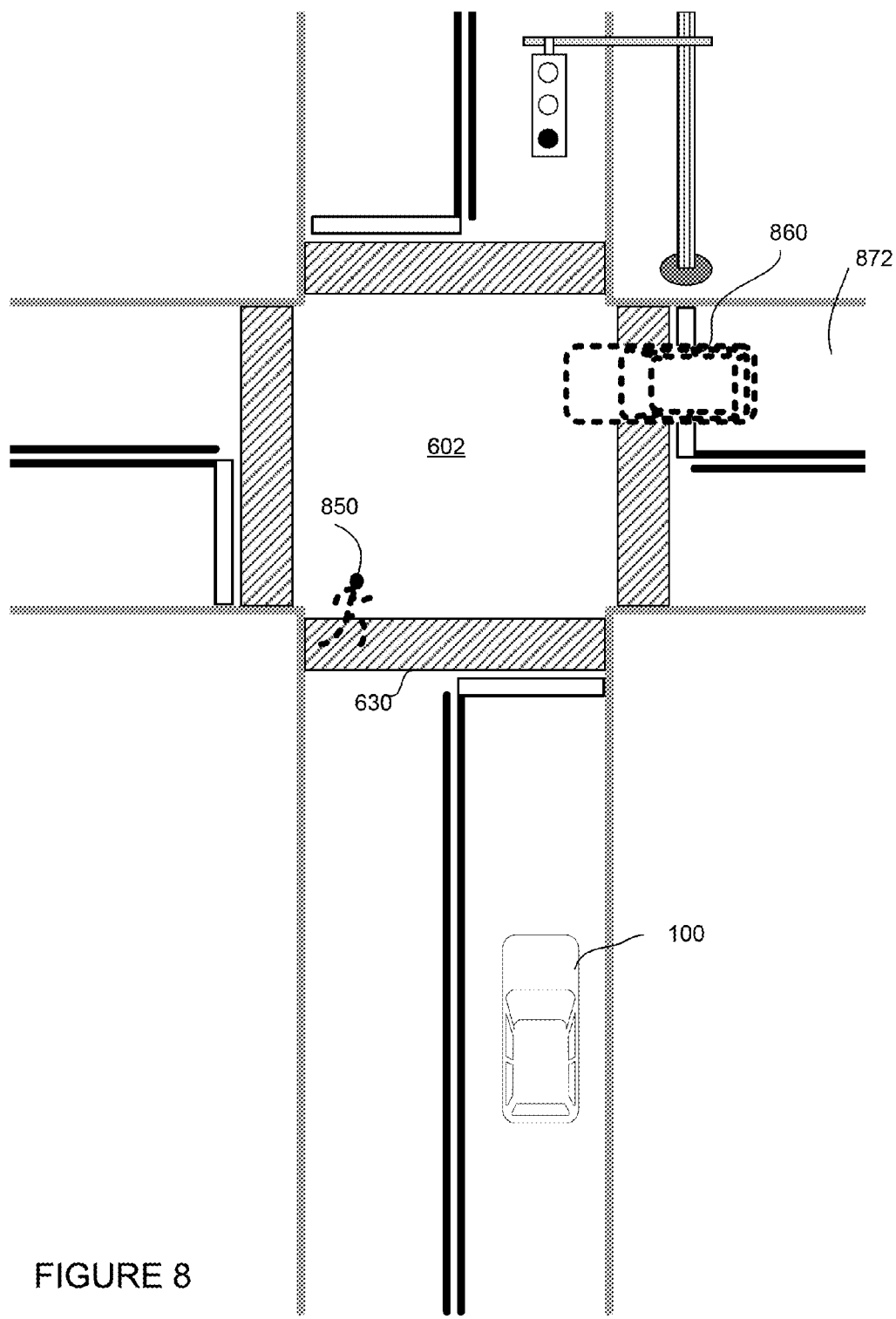
FIG. 8 is an example bird's eye view of the autonomous vehicle in a section of roadway including an intersection in an example scenario at a first time in accordance with aspects of the disclosure.
Figure 9:
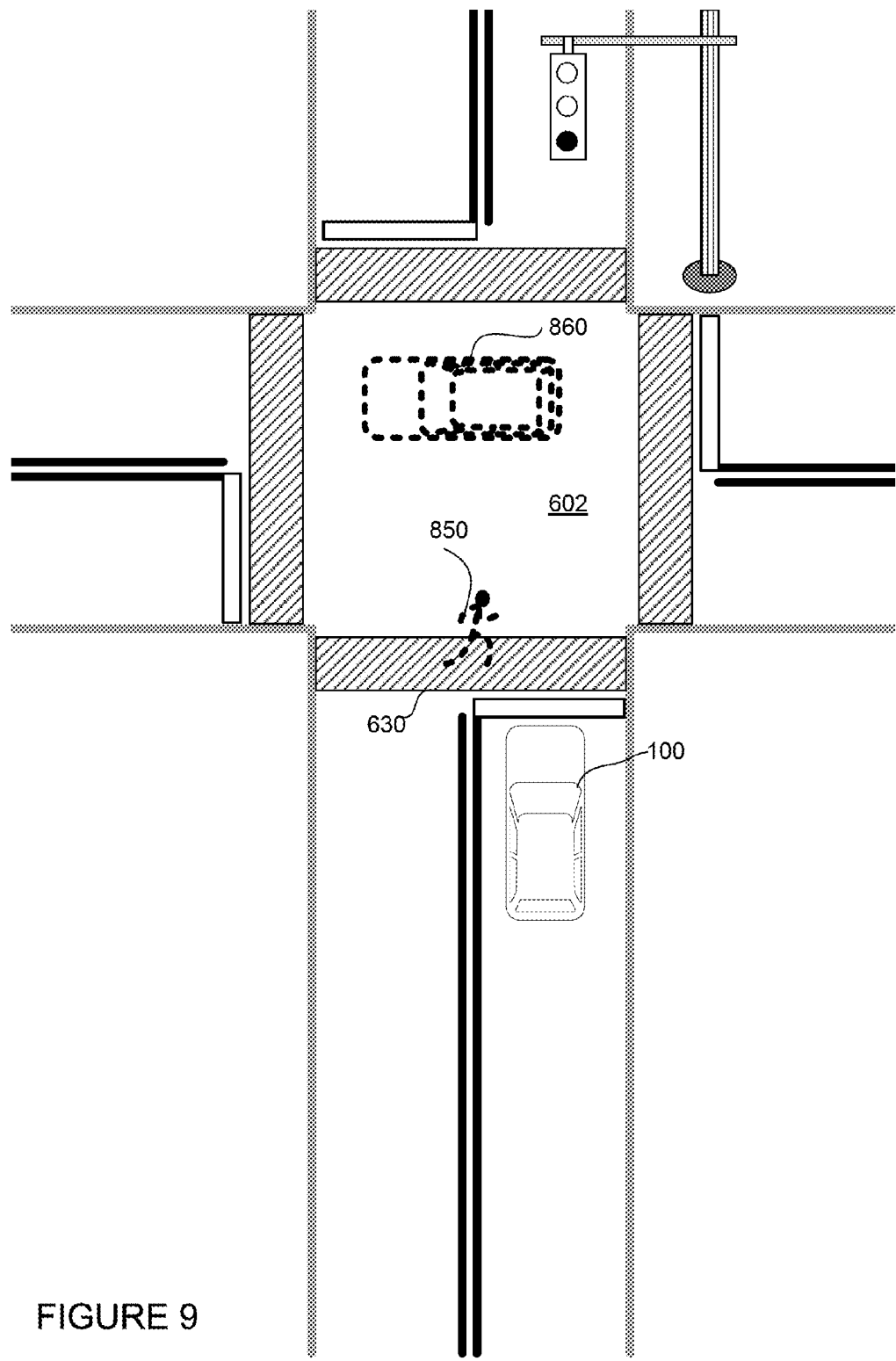
FIG. 9 is an example bird's eye view of the autonomous vehicle in the section of roadway including the intersection in the example scenario at a second time in accordance with aspects of the disclosure.

As the autonomous vehicle is driving along a roadway in an autonomous driving mode as shown in FIG. 7, the fictitious sensor data may be provided to the autonomous vehicle's computer at the appropriate time in order to run the scenario as shown in FIGS. 8 and 9. By doing so, the autonomous vehicle's computers may respond as if the virtual objects were real objects.

During this time, the autonomous vehicle's computer may log the results of the scenario including vehicle's behavior, dynamics and response time as shown in FIG. 10. This may include logging information about where the autonomous vehicle was located at the different times, errors (skidding, turning too hard, faulty maneuvering, etc.), and whether the autonomous vehicle contacted another object (virtual or real).

The results of scenario may then be evaluated. This evaluation may occur at the autonomous vehicle, for example, by the autonomous vehicle's computer or another testing computer, or at a later time by downloading the logged information and reviewing it offline. The valuation may be based on specialized, customized criteria, such as whether the vehicle collided (or nearly collided) with a virtual object, whether the vehicle accelerated, decelerated and steered appropriately for the scenario, whether the vehicle reached its intended destination, etc.

As noted above, a user may create or otherwise designate the features of the scenario in advance; however the scenarios may be triggered or started in various ways. For example, a user in the autonomous vehicle could initiate a scenario while the autonomous vehicle is driving itself. For instance, the user could use a computer connected to the autonomous vehicle to inject a virtual object such as a pedestrian into the autonomous vehicle's environment.

In addition, when identifying the features of a scenario, a user may provide a virtual object with flexibility. In this regard, the same virtual object could be provided with alternative behaviors. For example, a virtual object corresponding to a pedestrian could have two or more different object paths; one where the pedestrian crosses a roadway at time t=1 and another where the pedestrian crosses the roadway at time t=2 as shown in FIG. 11. When the scenario is initiated, one of the different object paths may be randomly selected and the corresponding fictitious sensor data provided to the autonomous vehicle's computer.

The scenarios may also be used to simulate features other than virtual objects. For example, the user may also specify state information about the autonomous vehicle's environment such as the state of traffic signals (red, yellow, green) at different times as well as failure conditions for various systems of the vehicle such as sensors or computers.

The aspects described above allow for the testing of autonomous vehicles in real world situations. Rather than testing the vehicle using real objects, such as people or dummies which would be dangerous and costly, the scenarios may be used numerous times with such costs or risks. Thus, in many cases, these testing scenarios described above may be repeated as needed for the sake of regression testing. In addition, as noted above, such simulations in real world environments may provide for better information about the dynamics of a vehicle and reaction speed in certain situations.

Example Systems

Figure 1:
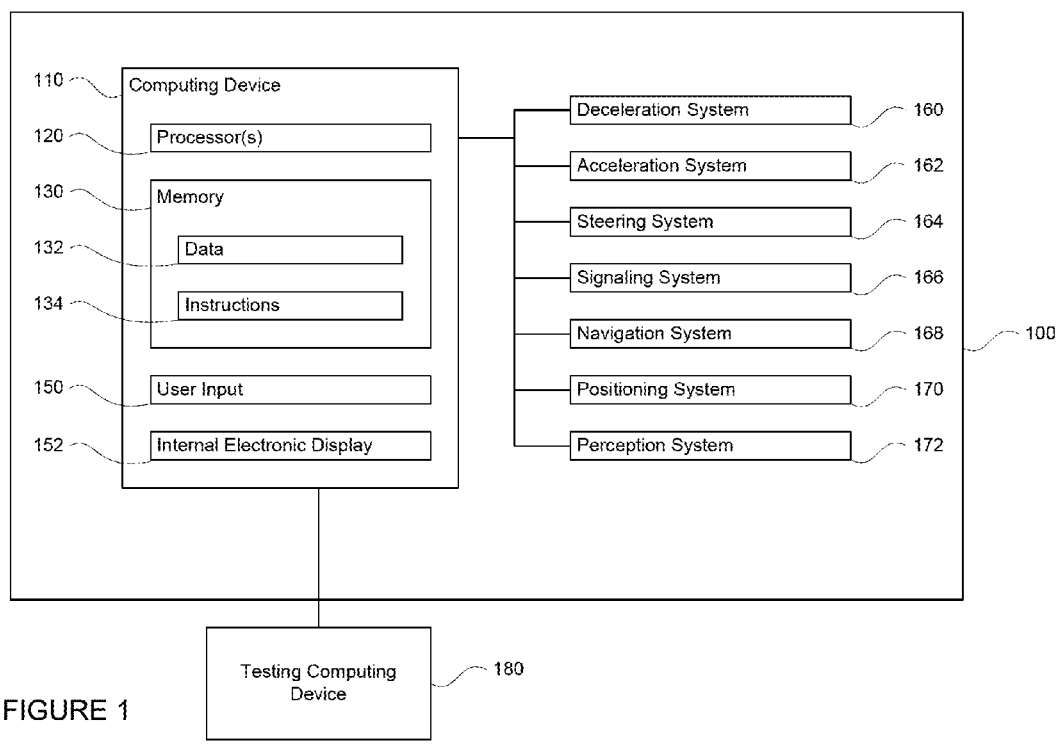
FIG. 1 is a functional diagram of a system in accordance with aspects of the disclosure.

As shown in FIG. 1, a vehicle 100 in accordance with one aspect of the disclosure includes various components. While certain aspects of the disclosure are particularly useful in connection with specific types of vehicles, the vehicle may be any type of vehicle including, but not limited to, cars, trucks, motorcycles, busses, boats, airplanes, helicopters, lawnmowers, recreational vehicles, amusement park vehicles, farm equipment, construction equipment, trams, golf carts, trains, and trolleys. The vehicle may have one or more computing devices, such as computing device 110 containing one or more processors 120, memory 130 and other components typically present in general purpose computing devices.

The memory 130 stores information accessible by the one or more processors 120, including data 132 and instructions 134 that may be executed or otherwise used by the processor(s) 120. The memory 130 may be of any type capable of storing information accessible by the processor(s), including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The data 132 may be retrieved, stored or modified by processor(s) 120 in accordance with the instructions 132. For instance, although the claimed subject matter is not limited by any particular data structure, the data may be stored in computing device registers, in a relational database as a table having a plurality of different fields and records, XML documents or flat files. The data may also be formatted in any computing device-readable format.

The instructions 134 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The one or more processors 120 may be any conventional processors, such as commercially available CPUs. Alternatively, the one or more processors may be a dedicated device such as an ASIC or other hardware-based processor, such as a field programmable gate array (FPGA). Although FIG. 1 functionally illustrates the processor(s), memory, and other elements of computing device 110 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing device 110. Accordingly, references to a processor or computing device will be understood to include references to a collection of processors or computing devices or memories that may or may not operate in parallel.

Computing device 110 may have all of the components normally used in connection with a computing device such as the processor and memory described above, as well as a user input 150 (e.g., a mouse, keyboard, touch screen and/or microphone) and various electronic displays (e.g., a monitor having a screen, a small LCD touch-screen or any other electrical device that is operable to display information). In this example, the vehicle includes an internal electronic display 152. In this regard, internal electronic display 152 may be located within a cabin of vehicle 100 and may be used by computing device 110 to provide information to passengers within the vehicle 100.

In one example, computing device 110 may be an autonomous driving computing system incorporated into vehicle 100. The autonomous driving computing system may capable of communicating with various components of the vehicle as needed in order to control the vehicle in fully autonomous (without input from a driver) as well as semi-autonomous (some input from a driver) driving modes.

Figure 2:
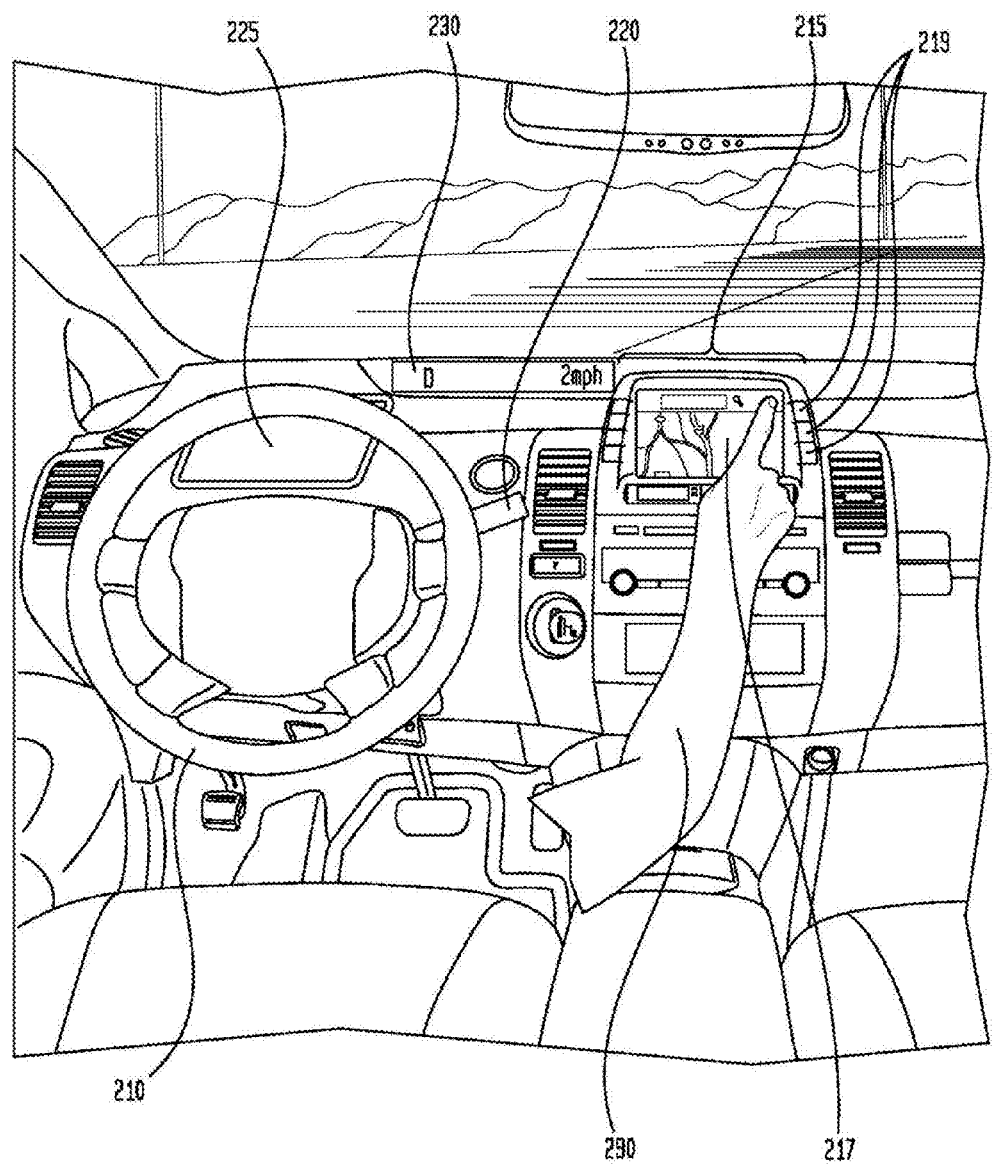
FIG. 2 is an interior of an autonomous vehicle in accordance with aspects of the disclosure.

As an example, FIG. 2 depicts an interior design of a vehicle having autonomous, semi-autonomous, and manual (continuous input from a driver) driving modes. In this regard, the autonomous vehicle may include all of the features of a non-autonomous vehicle, for example: a steering apparatus, such as steering wheel 210; a navigation display apparatus, such as navigation display 215 (which may be a part of electronic display 152); and a gear selector apparatus, such as gear shifter 220. The vehicle may also have various user input devices 140 in addition to the foregoing, such as touch screen 217 (again, which may be a part of electronic display 152), or button inputs 219, for activating or deactivating one or more autonomous driving modes and for enabling a driver or passenger 290 to provide information, such as a navigation destination, to the computing device 110.

Returning to FIG. 1, when engaged, the computing devices 110 may control some or all of these functions of vehicle 100 and thus be fully or partially autonomous. It will be understood that although various systems and computing device 110 are shown within vehicle 100, these elements may be external to vehicle 100 or physically separated by large distances.

In this regard, computing device 110 may be in communication various systems of vehicle 100, such as deceleration system 160, acceleration system 162, steering system 164, signaling system 166, navigation system 168, positioning system 170, and perception system 172, such that one or more systems working together may control the movement, speed, direction, etc. of vehicle 100 in accordance with the instructions 134 stored in memory 130. Although these systems are shown as external to computing device 110, in actuality, these systems may also be incorporated into computing device 110, again as an autonomous driving computing system for controlling vehicle 100.

As an example, computing device 110 may interact with deceleration system 160 and acceleration system 162 in order to control the speed of the vehicle. Similarly, steering system 164 may be used by computing device 110 in order to control the direction of vehicle 100. For example, if vehicle 100 configured for use on a road, such as a car or truck, the steering system may include components to control the angle of wheels to turn the vehicle. Signaling system 166 may be used by computing device 110 in order to signal the vehicle's intent to other drivers or vehicles, for example, by lighting turn signals or brake lights when needed.

Navigation system 168 may be used by computing device 110 in order to determine and follow a route to a location. In this regard, the navigation system 168 and/or data 132 may store map information, e.g., highly detailed maps identifying the shape and elevation of roadways, lane lines, intersections, crosswalks, speed limits, traffic signals, buildings, signs, real time traffic information, vegetation, or other such objects and information.

Positioning system 170 may be used by computing device 110 in order to determine the vehicle's relative or absolute position on a map or on the earth. For example, the position system 170 may include a GPS receiver to determine the device's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude as well as relative location information, such as location relative to other cars immediately around it which can often be determined with less noise that absolute geographical location.

The positioning system 170 may also include other devices in communication with computing device 110, such as an accelerometer, gyroscope or another direction/speed detection device to determine the direction and speed of the vehicle or changes thereto. By way of example only, an acceleration device may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the computing device 110, other computing devices and combinations of the foregoing.

The perception system 172 also includes one or more components for detecting and performing analysis on objects external to the vehicle such as other vehicles, obstacles in the roadway, traffic signals, signs, trees, etc. For example, the perception system 172 may include lasers, sonar, radar, cameras, or any other detection devices which record data which may be processed by computing device 110. In the case where the vehicle is a small passenger vehicle such as a car, the car may include a laser mounted on the roof or other convenient location as well as other sensors such as cameras, radars, sonars, and additional lasers. The computing device 110 may control the direction and speed of the vehicle by controlling various components.

The vehicle's perception system 172 and/or computing device 110 (using information received from the perception system) may thus rely on any known techniques for detecting and identifying objects in the vehicle's environment.

By way of example, if the vehicle is operating completely autonomously, computing device 110 may navigate the vehicle to a location using data from the detailed map information and navigation system 168. Computing device 110 may use the positioning system 170 to determine the vehicle's location and use the perception system 172 to detect, identify, and respond to objects when needed to reach the location safely. In order to do so, computing device 110 may cause the vehicle to accelerate (e.g., by increasing fuel or other energy provided to the engine by acceleration system 162), decelerate (e.g., by decreasing the fuel supplied to the engine or by applying brakes by deceleration system 160), change direction (e.g., by turning the front or rear wheels of vehicle 100 by steering system 164), and signal such changes (e.g. by lighting turn signals of signaling system 166).

Testing computing device 180 may be used to test sensors and responses of the vehicle 100. For example, the testing computing device 180 may supply fictitious sensor data to the vehicle's sensors. The fictitious sensor data may include a virtual object in the vehicle's environment, wherein the virtual object corresponds to a real object that is not in the vehicle's environment. For example, a virtual object representing a pedestrian crossing an intersection may be fed to the vehicle's perception system 172.

Types of virtual objects, such as pedestrians, bicyclists, cones, etc., may vary. Additionally, scenarios may be created for any of the virtual objects, giving the virtual objects a predefined behavior, such as moving in a particular direction, at a particular location, at a particular rate of speed. The scenarios may include environmental state information, such as weather or a color of a traffic light. The scenarios may further simulate failure situations, such as failure of sensors, systems, computers, etc.

The testing computing device 180 may also be used to analyze the vehicle's response to the fictitious sensor data. For example, the testing computing device 180 may measure response times, accuracy, and the like, and may maintain a record of such information. Alternatively or additionally, records of the vehicle's response may be maintained in the memory 130.

While the testing computing device 180 is shown in FIG. 1 as being located outside the vehicle 100, the location and implementation of the testing computing device 180 may be varied. In some examples, the testing computing device 180 may be a separate computing device positioned within the vehicle or around the vehicle 100. In other examples, the testing computing device 180 may be a module programmed into the vehicle computing device 110. In other example, the testing computing device 180 may be located remotely from the vehicle and communicate with the vehicle via wireless signal.

Figure 3:
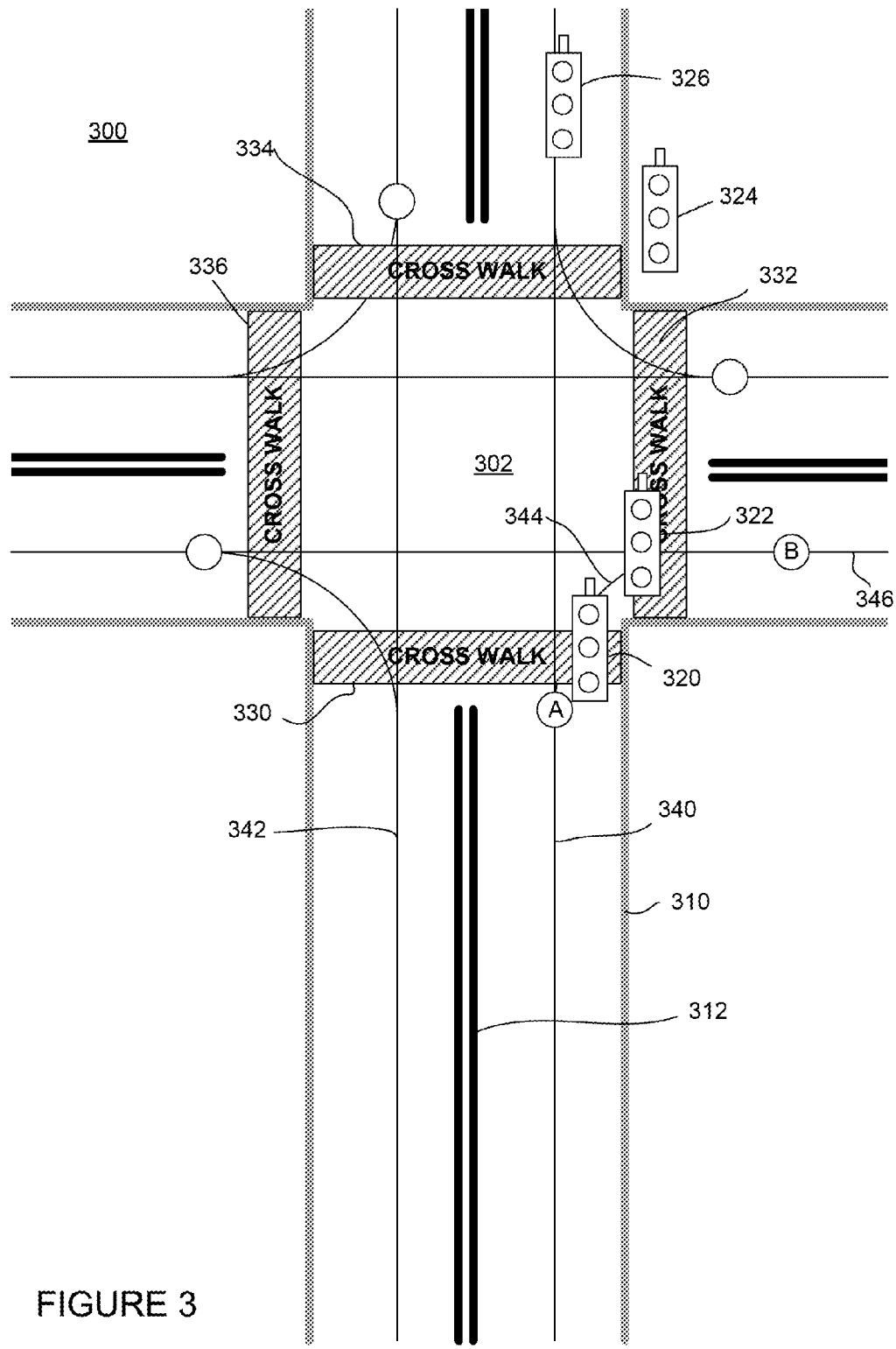
FIG. 3 is an example of detailed map information of a section of roadway including an intersection in accordance with aspects of the disclosure.

FIG. 3 is an example of detailed map information 300 for a section of roadway including an intersection 302. In this example, the detailed map information 300 includes information identifying the shape, location, and other characteristics of lane lines 310, 312, traffic signals 320, 322, 324, 326, and crosswalks 330, 332, 334, 336.

In addition, the detailed map information includes a network of rails 340, 342, 344, 346 which provide the vehicle's computer with guidelines for maneuvering the vehicle so that the vehicle follows the rails and obeys traffic laws. As an example, a vehicle's computer may maneuver the vehicle from point A to point B (two fictitious locations not actually part of the detailed map information) by following rail 340, transitioning to rail 344, and subsequently transitioning to rail 346 in order to make a right turn at intersection 302.

Figure 4:
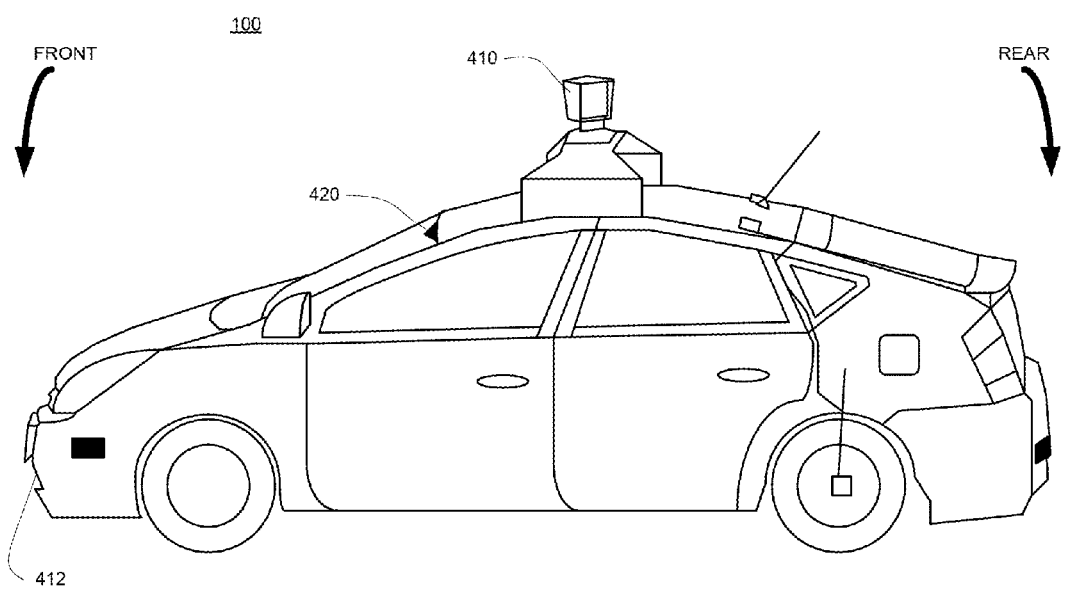
FIG. 4 is an exterior of an autonomous vehicle in accordance with aspects of the disclosure.

FIG. 4 is an example external view of vehicle 100 described above. As shown, various components of the perception system 172 may be positioned on or in the vehicle 100 in order to better detect external objects while the vehicle is being driven. In this regard, one or more sensors, such as laser range finders systems 410 and 412 including one or more lasers and associated computing devices may be positioned or mounted on the vehicle. In addition, the perception system may include one or more cameras 420 mounted internally on the windshield of vehicle 100 to receive and analyze various images about the environment. In addition to the laser range finder systems 410 and 412 and the one or more cameras 420 mounted internally on the windshield, other detection devices, such as sonar, radar, GPS, etc., may also be positioned in a similar manner.

Example Methods

In addition to the operations described above and illustrated in the figures, various operations will now be described. It should be understood that the following operations do not have to be performed in the precise order described below. Rather, various steps can be handled in a different order or simultaneously, and steps may also be added or omitted.

FIG. 5 provides an example of fictitious sensor data provided to a vehicle under test. The fictitious sensor data may include information regarding a type of virtual objects in addition to a behavior plan for the virtual objects. For example, object type 510 may be a pedestrian, motorcycle, car, bicyclist, or any other object that could potentially be on or near a roadway. Physical characteristics 512 may be defined for each object type. The physical characteristics 512 may define a size, shape, or other information defining an appearance of the virtual object. Behavior plan 520 may include an object path, for example, defining a path from one position on or near the roadway to another. In other examples, the behavior plan may dictate what the virtual object is doing at any given time. For example, for a given time 522, the virtual object may have a location 524, heading 526, and acceleration value 528. The virtual object may move through the behavior plan in sequence.

FIG. 6 illustrates an example of fictitious sensor data in relation to a roadway 600, including intersection 602. Intersection 602 corresponds to the intersection 302 of the detailed map information 300. In this regard, lane lines 610, 612, correspond to the shape, location, and other characteristics of lane lines 310, 312, respectively. Similarly crosswalk 630 corresponds to the shape, location, and other characteristics of crosswalk 330. In the example of FIG. 6, traffic signals corresponding to traffic signals 320, 322, 324, and 326 are not shown for purposes of clarity.

The predefined virtual objects execute predefined behavior plans, as described above in connection with FIG. 5. For example, virtual pedestrian 650 may execute a predefined behavior plan such that the virtual pedestrian 650 appears to run across crosswalk 630. In some examples, multiple virtual objects may execute behavior plans at a same time. For example, virtual car 660 travels straight into intersection 602 from westbound lane 672.

FIG. 7 illustrates an actual environment of vehicle 100 as it approaches the intersection 602. As noted above, a vehicle's one or more computing devices may maneuver the vehicle using the various systems described above. In this example, the roadway 600 may be closed for vehicle testing. Accordingly, no actual people or other vehicles are present in the intersection 602 or elsewhere in or near the roadway 600. As vehicle 100 approaches intersection 602, the vehicle's perception system may detect and identify the various features of the intersection 602.

FIG. 8 depicts the fictitious sensor data input to the vehicle 100. While there are still no actual objects in the intersection 602, the fictitious sensor data is provided to the vehicle 100 at appropriate times to run one or more scenarios. Accordingly, at a first time, as vehicle 100 approaches intersection 602, the vehicle's perception system may detect and identify the various features of the intersection 602 as well as virtual objects. For example, the perception system may detect and identify virtual pedestrian 850 in the crosswalk 630, and virtual car 860 entering the intersection 602 from the lane 672. The virtual pedestrian 850 and the virtual car 860 may be executing a behavior plan as part of a predefined scenario.

FIG. 9 depicts the fictitious sensor data at a second time in the scenario. At the second time, the vehicle 100 is almost at the crosswalk 630, the virtual pedestrian 850 has moved approximately halfway across the crosswalk 630, and the virtual car 860 has fully entered the intersection 602. Perceiving these virtual objects, the vehicle 100 may autonomously react. For example, the vehicle 100 may slow down and stop before the crosswalk 630. In response to perceiving virtual objects in other scenarios, the vehicle 100 may react differently, such as by changing lanes, accelerating or signaling to a driver to take control of the vehicle 100.

Reaction information for the vehicle 100 may be recorded and used for analysis of the vehicle's sensors and other systems, such as steering, braking, etc. FIG. 10 provides an example of vehicle reaction information for a particular scenario. The reaction information indicates, for each given time 822, a location 824, heading 826, and acceleration value 828 of the vehicle 100. Further indicated for each given time 822 is whether the vehicle contacted the virtual object 830, whether an error occurred 832, and a type of the error 834.

Whether the vehicle 100 made contact with the virtual object may be determined based on a path of the locations 824. For example, the locations 824 may be compared with the locations of the virtual object to determine whether the autonomous vehicle crossed a given location of the virtual object at a time when the virtual object was at the given location.

Whether or not the vehicle made contact with the virtual object, errors may be determined and recorded. For example, if the vehicle did make contact with the virtual object, it may have attempted to stop but failed because the vehicle skidded. Other types of errors may include turning too hard, maneuvers that do not work as expected, mechanical errors such as faulty brakes, etc.

While the reaction information shown in FIG. 10 indicates some information about the vehicle's 100 response to the virtual objects in the scenario, additional types of information may also be logged. Moreover, the reaction information may be analyzed to determine further information. For example, the reaction information may be compared with the behavior plan for the virtual object to determine reaction times, relative positioning, etc. The analysis may occur at the autonomous vehicle, for example, by the vehicle's computer or another testing computer. In other examples, the analysis may be performed later, such as by downloading the reaction information to another computing device.

In some examples, when defining a scenario, a virtual object may be provided with alternative behavior plans. For example, FIG. 11 illustrates a first behavior plan 1120 and an alternative behavior plan 1160. The alternative behavior plans may provide different object paths for the virtual object. For example, while the first behavior plan 1120 may provide for the virtual pedestrian walking across the street at a first time, the second behavior plan 1160 may provide for the virtual pedestrian running partially across the street and stopping at a second time. When the scenario is initiated, one of the different behavior plans may be selected and corresponding fictitious data provided to the vehicle's computer. For example, the selection of the behavior plan may be random or may be dependent on any other information, such as time of day, environmental conditions, vehicle speed, etc.

In some examples, the scenarios may be used to simulate other features in addition or as an alternative to virtual object behavior. For example, the scenario can define a state of a traffic signal (red, yellow, or green). Further, the scenario can be defined to simulate failure conditions. For example, failure of sensors, steering systems, braking systems, computers, etc. may be simulated to test the vehicle's response. Any of the scenarios may be initiated in response to feedback from the vehicle. For example, when the vehicle reaches a predetermined position on the roadway, a virtual pedestrian can suddenly appear.

Figure 12:
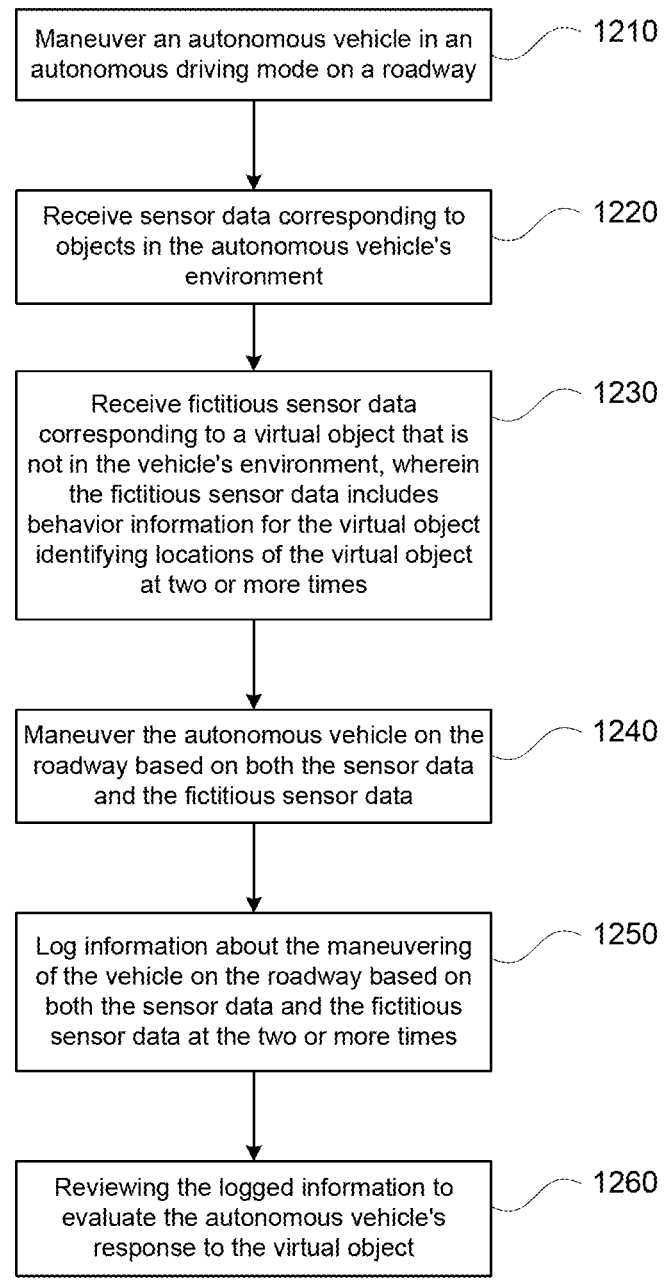
FIG. 12 is an example flow diagram in accordance with aspects of the disclosure.

FIG. 12 is an example flow diagram 1200 which depicts some of the aspects described above which may be performed by one or more computing devices such as one or more computing devices 110 of vehicle 100. While the operations are described below in a particular order, it should be understood that the operations may be performed in a different order or simultaneously. Moreover, operations may be added or omitted.

In block 1210, the autonomous vehicle maneuvers in an autonomous driving mode on a roadway. As the vehicle maneuvers, it receives sensor information corresponding to objects in its environment (block 1220). For example, the vehicle's sensors may detect lane markings, curbs, street signs, and the like.

In block 1230, the vehicle receives fictitious sensor data corresponding to a virtual object, the virtual object representing an actual object that is not in the vehicle's environment. The virtual object may be a representation of a pedestrian, cyclist, vehicle, animal, or any other object. The fictitious sensor data further includes behavior information for the virtual object, the behavior information including at least one object path. For example, the behavior information may define presence of the virtual object at a first location at a first time, and at a second location at a second time.

In block 1240, the autonomous vehicle maneuvers on the roadway based on both the sensor data received at block 1220 and the fictitious sensor data received at block 1230. For example, the vehicle may detect a virtual pedestrian and a guardrail. While the vehicle may take action to avoid the virtual pedestrian, it will also try to avoid the guardrail if possible. Therefore, the vehicle may slow down and stop as opposed to veering.

In block 1250, information pertaining to the maneuvering of the vehicle is logged. This information may be reviewed (block 1260) to evaluate the vehicle's response. For example, it may be determined whether the vehicle avoided the virtual object or otherwise reacted appropriately. Moreover, it may be determined whether errors occurred or whether any of the vehicle's systems are faulty.

The features described above allow for testing of autonomous vehicles in real world situations. Rather than testing using live people, which would be dangerous, or dummies, which is time consuming and costly, the testing is based on virtual object data that is input to the vehicle's sensor systems. Accordingly, scenarios may be run multiple times without variation to more efficiently gauge whether changes to the vehicle were effective. Moreover, different scenarios may be selected at random or based on any other criteria and run one after another without down time in between.

Although the examples described above relate to autonomous vehicles, this information may be used in non-autonomous vehicles or autonomous vehicle's operating in semi-autonomous or manual driving modes. In this regard, when the fictional sensor data indicates a virtual object in the vehicle's path, a notification may be provided to the driver indicating the presence of the virtual object, for example, along with a warning. In more sophisticated systems, a vehicle's one or more computing devices may automatically apply the vehicle's brakes or otherwise limit or reduce the acceleration of the vehicle (prevent acceleration, reduce gas flow, or limit electricity flowing to the vehicle's engine) to slow the vehicle down.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A system for testing a vehicle using virtual objects, the system comprising:
   one or more memories storing virtual object data, first behavior plan for a virtual object of the virtual object data, and alternative second behavior plan for the virtual object wherein the first behavior plan and the alternative second behavior plan each define different paths for the virtual object;
   one or more testing computing devices in communication with the one or more memories, the one or more processors being configured to:
     randomly select one of the first behavior plan or the alternative second behavior plan,
     generate simulated sensor data for the virtual object based on the randomly selected one of the first behavior plan or the alternative behavior plan, and
     send the simulated sensor data to one or more controlling computing devices, and
   the one or more controlling computing devices in communication with the one or more memories, the one or more computing devices being configured to:
     receive real sensor data corresponding to real objects in the vehicle's environment detected by one or more sensors of the vehicle;
     receive, from the one or more testing computing devices, the simulated sensor data corresponding to the virtual object being in the vehicle's environment, such that the one or more controlling computing devices identify the virtual object as a real object in the vehicle's environment that is executing the randomly selected one of the first behavior plan or the alternative second behavior plan even when the virtual object does not exist in the vehicle's environment; and
     maneuver the vehicle based on both the real object data and the simulated sensor data to test a maneuvering response of the vehicle.

2. The system of claim 1, wherein the one or more testing computing device is further configured to receive, from the one or more controlling computing devices, information about the maneuvering of the vehicle based on both the sensor data and the virtual simulated sensor data and record, in the one or more memories, the information.

3. The system of claim 2, the one or more testing computing devices are further configured to analyze the recorded information to evaluate the maneuvering response.

4. The system of claim 1, wherein the randomly selected one of the first behavior plan or the alternative second behavior plan identifies a path of locations the virtual object at two or more times.

5. The system of claim 4, wherein the randomly selected one of the first behavior plan or the alternative second behavior plan identifies at least one location of the virtual object, a direction of movement of the virtual object, a speed of the virtual object, and at least one physical characteristic of the virtual object.

6. The system of claim 4, wherein the one or more testing computing devices are further configured to log information about the maneuvering of the vehicle at the two or more times.

7. The system of claim 6, wherein the logging includes recording information about whether the vehicle experienced an error at the two or more times.

8. The system of claim 4, wherein the one or more testing computing devices are further configured to determine based on the path of locations whether the vehicle crossed a given location of the virtual object at a time when the virtual object was at the given location.

9. The system of claim 1, wherein receiving the simulated sensor data is triggered by a status of the vehicle.

10. The system of claim 1, further comprising the vehicle.

11. A method for testing a vehicle using virtual objects, the method comprising:
   randomly selecting, by one or more testing computing devices, one of a first behavior plan for a virtual object or alternative second behavior plan for the virtual object, wherein the first behavior plan and the alternative second behavior plan each define different paths for the virtual object,
   generating, by the one or more testing computing devices, simulated sensor data for the virtual object based on the randomly selected one of the first behavior plan or the alternative behavior plan, and
   sending, by the one or more testing computing devices, the simulated sensor data to one or more controlling computing devices, and
   receiving, by one or more controlling computing devices, real sensor data corresponding to real objects in the vehicle's environment detected by one or more sensors of the vehicle;

receiving, from the one or more testing computing devices by the one or more controlling computing devices, the simulated sensor data corresponding to the virtual object being in the vehicle's environment, such that the one or more controlling computing devices identify the virtual object as a real object in the vehicle's environment that is executing the randomly selected one of the first behavior plan or the alternative second behavior plan even when the virtual object does not exist in the vehicle's environment; and maneuvering, by the one or more controlling computing devices, the vehicle based on both the real object data and the simulated sensor data to test a maneuvering response of the vehicle.

12. The method of claim 11, further comprising logging, by the one or more testing computing devices, information about the maneuvering of the vehicle based on both the sensor data and the virtual object data for testing a maneuvering response of the vehicle.

13. The method of claim 11, further comprising, prior to randomly selecting one of the first behavior plan or the alternative second behavior plan, receiving from a user in the vehicle a user selection identifying both the first behavior plan and the alternative second behavior plan.

14. The method of claim 12, further comprising receiving behavior information for the virtual object, the behavior information identifying a path of locations the virtual object at two or more times.

15. The method of claim 14, wherein the logging includes recording the information about the maneuvering of the vehicle at the two or more times.

16. The method of claim 14, further comprising:
determining based on the path of locations whether the vehicle crossed a given location of the virtual object at a time when the virtual object was at the given location, and
wherein the logging includes recording information about whether the vehicle crossed the given location of the virtual object.

17. The method of claim 12, further comprising reviewing, by the one or more testing computing devices, the logged information to evaluate the maneuvering response.

18. The method of claim 14, wherein the logging includes recording information about whether the vehicle experienced an error at the two or more times.

19. The method of claim 11, wherein the randomly selected one of the first behavior plan or the alternative second behavior plan for the virtual object identifies at least one location of the virtual object, a direction of movement of the virtual object, a speed of the virtual object, and at least one physical characteristic of the virtual object.

20. The method of claim 11, wherein the simulated sensor data further includes information about a fictitious state of an actual traffic signal light.

* * * * *